(12) United States Patent
Yamada et al.

(10) Patent No.: US 6,768,516 B2
(45) Date of Patent: Jul. 27, 2004

(54) SEMICONDUCTOR DEVICE CONSTITUTING A CMOS CAMERA SYSTEM

(75) Inventors: Satoshi Yamada, Tokyo (JP); Michitaka Kimura, Tokyo (JP); Naoto Ueda, Tokyo (JP); Masatoshi Yasunaga, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 722 days.

(21) Appl. No.: 09/732,925

(22) Filed: Dec. 11, 2000

(65) Prior Publication Data

US 2001/0050717 A1 Dec. 13, 2001

(30) Foreign Application Priority Data

Jun. 12, 2000 (JP) .................................... 2000-176046

(51) Int. Cl.[7] .............................................. H04N 5/225
(52) U.S. Cl. ..................... 348/340; 348/340; 348/375; 348/76
(58) Field of Search ............................ 348/207.99, 335, 348/340, 373, 374, 375, 294, 311, 61, 65, 66, 67, 75, 76; 359/822, 819

(56) References Cited

U.S. PATENT DOCUMENTS 4,594,613 A * 6/1986 Shinbori et al. ............ 348/340
5,040,069 A * 8/1991 Matsumoto et al. .......... 348/76
5,418,566 A * 5/1995 Kameishi .................... 348/294
5,847,887 A * 12/1998 Ogura et al. ................ 359/822

FOREIGN PATENT DOCUMENTS

| JP | 6-109464 | 4/1994 |
| JP | 6-275855 | 9/1994 |
| JP | 11-76156 | 3/1999 |
| KR | 1999-0081448 | 11/1999 |

* cited by examiner

Primary Examiner—Tuan Ho
(74) Attorney, Agent, or Firm—McDermott Will & Emery LLP

(57) ABSTRACT

The invention is intended for rendering a CMOS camera compact and less costly. A semiconductor device constituting a CMOS camera system includes a lens unit which includes a wiring board having an image pick-up opening formed therein and a lens, and the lens is provided on one side of the wiring board and positioned opposite the image pick-up opening. An image pick-up semiconductor is provided on the other side of the wiring board, and is positioned opposite the image pick-up opening, and is connected to a connection section of the wiring board by means of flip-chip bonding. An image processing semiconductor is connected by means of flip-chip bonding to another connection section provided on the other side of the wiring board, and processes an image signal output from the image pick-up semiconductor.

19 Claims, 9 Drawing Sheets

SEMICONDUCTOR DEVICE CONSTITUTING A CMOS CAMERA SYSTEM

BACKGROUND OF THE INVENTION

1. Field of the Invention

The present invention relates to a semiconductor device, and more particularly, to a semiconductor device constituting a CMOS camera system.

2. Background Art

A mobile device, such as a portable terminal or a portable cellular phone, is equipped with a semiconductor device called a CMOS camera, which is a combination of an image pick-up semiconductor and a lens unit. A CMOS camera system is constituted by means of combination of an image processing semiconductor device for processing an image signal captured by a CMOS camera, and a display device for displaying an image in response to the thus-processed signal.

FIG. 20 is a side view showing the outline of a conventional semiconductor device constituting a CMOS camera system.

In the drawing, reference numeral 1 designates a CMOS camera. The CMOS camera 1 comprises a lens unit 3 having a lens 2, and an image pick-up semiconductor 4 provided opposite the lens 2.

Reference numeral 5 designates a flexible wiring board which supports the CMOS camera 1 and exchanges an image signal with the CMOS camera 1 by way of wire bonding connections 6 provided between the image pick-up semiconductor 4 and the CMOS camera 1. The flexible wiring board 5 is formed from polyimide. Reference numeral 7 designates a motherboard connected to the flexible wiring board 5 by way of a connector 8. Reference numeral 9 designates an image processing semiconductor which is mounted on the motherboard 7 and processing an image signal output from the image pick-up semiconductor 4. Reference numeral 10 designates a control unit including memory for reserving a processed image signal. Reference numeral 11 designates a display for displaying an image. The image pick-up semiconductor 4 or the image processing semiconductor 7 is a semiconductor chip, semiconductor element or semiconductor device to be precisely, but will be abbreviated simply as a semiconductor in this description.

Since the conventional semiconductor device constituting a CMOS camera system is configured as described above, the semiconductor device became large and costly.

SUMMARY OF THE INVENTION

The present invention has been conceived to solve such a problem and is aimed at providing a compact and less-costly semiconductor device by means of integrating a CMOS camera and an image processing semiconductor, which was conventionally mounted on a motherboard, into a single unit.

According to one aspect of the present invention, a semiconductor device, constituting a CMOS camera system, comprises a lens unit, an image pick-up semiconductor and an image processing semiconductor. The lens unit includes a wiring board having an image pick-up opening formed therein and a lens, and the lens is provided on one side of the wiring board and positioned opposite the image pick-up opening. The image pick-up semiconductor is provided on the other side of the wiring board, positioned opposite the image pick-up opening, and is connected to a connection section of the wiring board by means of flip-chip bonding. Further, the image processing semiconductor is connected to another connection section provided on the other side of the wiring board by means of flip-chip bonding, and processes an image signal output from the image pick-up semiconductor.

According to another aspect of the present invention, a semiconductor device, constituting a CMOS camera system, comprises a lens unit, an image pick-up semiconductor and an image processing semiconductor. The lens unit includes a wiring board having an image pick-up opening formed therein and a lens, and the lens is provided on one side of the wiring board and positioned opposite the image pick-up opening. Further, the image pick-up semiconductor is provided on the other side of the wiring board, positioned opposite the image pick-up opening, and is connected to one connection section of the wiring board by means of flip-chip bonding. Further, the image processing semiconductor is connected to another connection section provided on the other side of the wiring board by means of wire bonding, and processes an image signal output from the image pick-up semiconductor.

According to another aspect of the present invention, a semiconductor device, constituting a CMOS camera system, comprises a flexible wiring board, a wiring board, a lens unit, an image pick-up semiconductor and an image processing semiconductor. The flexible wiring board has a connection section on one side. The wiring board is mounted on the other side of the flexible wiring board and has an image pick-up opening and a recess formed between the image pick-up opening and the flexible wiring board so as to communicate with the image pick-up opening, and includes a connection section provided within the recess. The lens unit is provided on the one side of the wiring board opposite the flexible wiring board so as to oppose the image pick-up opening. The image pick-up semiconductor is provided within the recess of the wiring board so as to oppose the image pick-up opening, and is connected to the connection section of the recess by means of flip-chip bonding. Further, the image processing semiconductor is connected to the connection section of the flexible wiring board by means of wire bonding.

Other and further objects, features and advantages of the invention will appear more fully from the following description.

DETAILED DESCRIPTION OF THE PREFERRED EMBODIMENTS

Figure 1:
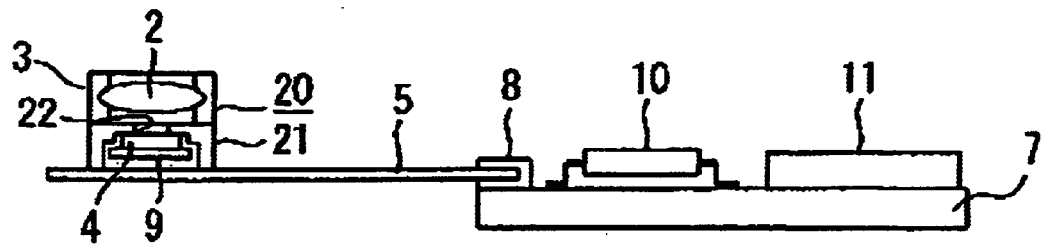
FIG. 1 is a schematic representation showing a structure of a CMOS camera system according to a first embodiment of the present invention.

Preferred embodiments of the present invention will now be described with reference to the accompanying drawings. In the drawings same or corresponding portions are represented by same reference numerals, and the detailed descriptions thereof may be abbreviated or omitted.

First Embodiment

A CMOS camera system according to a first embodiment of the present invention will now be described by reference to the accompanying drawings.

Figure 2:
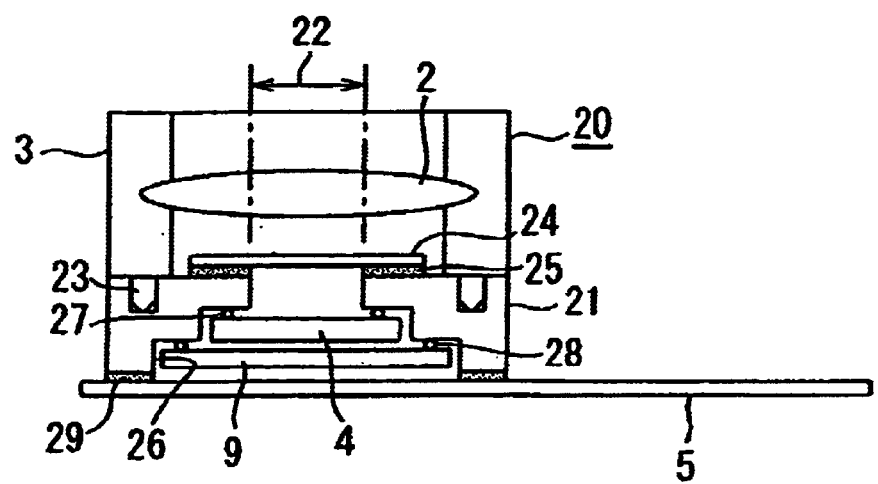
FIG. 2 is a cross-sectional view schematically showing a structure of the CMOS camera shown in FIG. 1.

FIG. 1 is a schematic representation showing a structure of a CMOS camera system according to the first embodiment; and FIG. 2 is a schematic representation showing the configuration of a CMOS camera.

In the drawings, reference numeral 20 designates a CMOS camera constituting the principal section of the CMOS camera system according to the first embodiment, and the detailed structure of the CMOS camera is shown in FIG. 2. More specifically, reference numeral 21 designates a stepped wiring board provided on a flexible wiring board 5; 22 designates an image pick-up opening formed in the stepped wiring board 21; and 3 designates a lens unit provided on one surface of the stepped wiring board 21. A lens 2 is placed in the front surface of the image pick-up opening 22. Reference numeral 23 designates a positioning pin for positioning the lens unit 3 on the stepped wiring board 21; and 24 designates a filter which is provided in the image pick-up opening, such as an infrared-ray cutting filter or a high-frequency cutting filter, and is mounted on one surface of the stepped wiring board 21 by means of an adhesive. Reference numeral 26 designates a recess formed in the other surface of the stepped wiring board 21 so as to communicate with the image pick-up opening 22. The recess 26 is formed by means of forming two-level steps in the surface of the stepped wiring board 21. A connection section with which a wiring board is to be connected is provided in each of the two-level steps.

Reference numeral 4 designates an image pick-up semiconductor provided in the two-level steps closer to the image pick-up opening 22. The image pick-up semiconductor 4 is flip-chip-bonded to the connection section of the recess 26 by way of bumps 27.

Reference numeral 9 designates an image processing semiconductor mounted on the second step of the recess 26 of the stepped wiring board 21. The image processing semiconductor 9 processes an image signal output from the image pick-up semiconductor 4 and is flip-chip-bonded to a connection section of the step by way of projecting electrodes (bumps) 28. Here, projecting electrodes 27 and 28 may be provided on either the stepped wiring board 21 or a semiconductor chip. Reference numeral 29 designates an electrical junction between the stepped wiring board 21 and the flexible wiring board 5.

Reference numeral 7 designates a motherboard connected to the flexible wiring board 5 by way of a connector 8; 10 designates a control unit which is mounted on the mother board 7 and includes memory for reserving an image signal output from the image processing semiconductor 9; and 11 designates a display for displaying an image. A CMOS camera system is configured by means of combination of the CMOS camera 20 including the image processing semiconductor 9, the control unit 10 mounted on the motherboard 7, and the display 11. Since the image processing semiconductor 9 and the CMOS camera 20 are assembled into a single unit, the motherboard 7 is miniaturized and can be made less costly.

Second Embodiment

A second embodiment of the present invention will now be described, by reference to a corresponding drawing.

Figure 3:
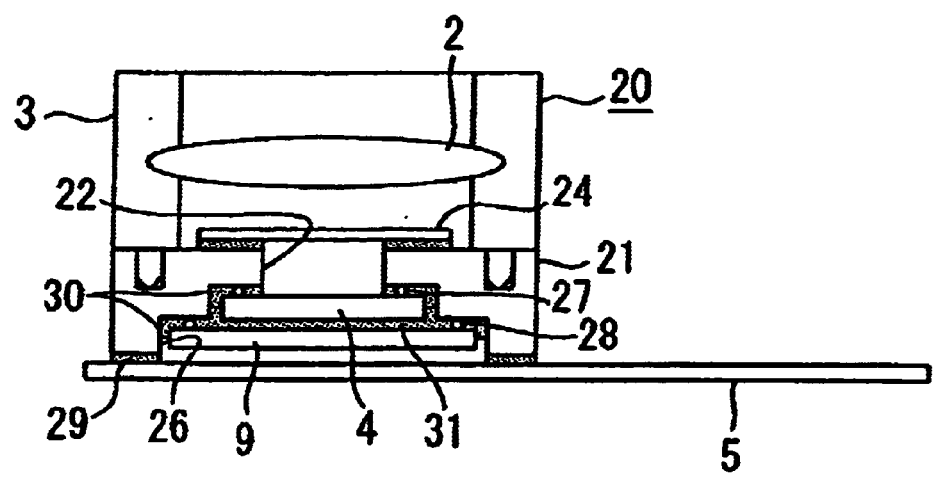
FIG. 3 is a cross-sectional view schematically showing a structure of a CMOS camera according to a second embodiment of the present invention.

FIG. 3 is a cross-sectional view showing a structure of a CMOS camera according to the second embodiment. In the drawing, those elements which are the same as those shown in FIG. 2 are assigned the same reference numerals, and repeated explanation thereof is omitted.

The CMOS camera according to the present embodiment differs from that shown in FIG. 2 in that a flip-chip-bonded section of the image pick-up semiconductor 4 and a flip-chip-bonded section of the image processing semiconductor 9 are sealed with insulating resin, thereby increasing the reliability of a flip-chip-bonded section and the strength of the flip-chip-bonded section. More specifically, in FIG. 3, reference numeral 30 designates insulating resin for sealing flip-chip-bonded sections which is filled into areas around the projecting electrode 27 on which the image pick-up semiconductor 4 is to be flip-chip-bonded and areas around the projecting electrode 28 on which the image processing semiconductor 9 is to be flip-chip-bonded. For example, epoxy resin or silicon resin is used as the insulating resin. Resin of a single type is usually used for sealing areas around the projecting electrode 27 and areas around the projecting electrode 28. In some cases, one type of insulating resin is used for sealing areas around the projecting electrode 27, and another type of insulating resin is used for sealing areas around the projecting electrode 28. The image pick-up semiconductor 4 is not bonded to the image processing semiconductor 9 by way of resin. If the image pick-up semiconductor 4 and the image processing semiconductor 9 remain independent of each other, there is prevented stress, which would otherwise be caused by mutual influence of the image pick-up semiconductor 4 and the image processing semiconductor 9. As a result, stress can be comprehensively mitigated.

Third Embodiment

A third embodiment of the present invention will now be described, by reference to a corresponding drawing.

Figure 4:
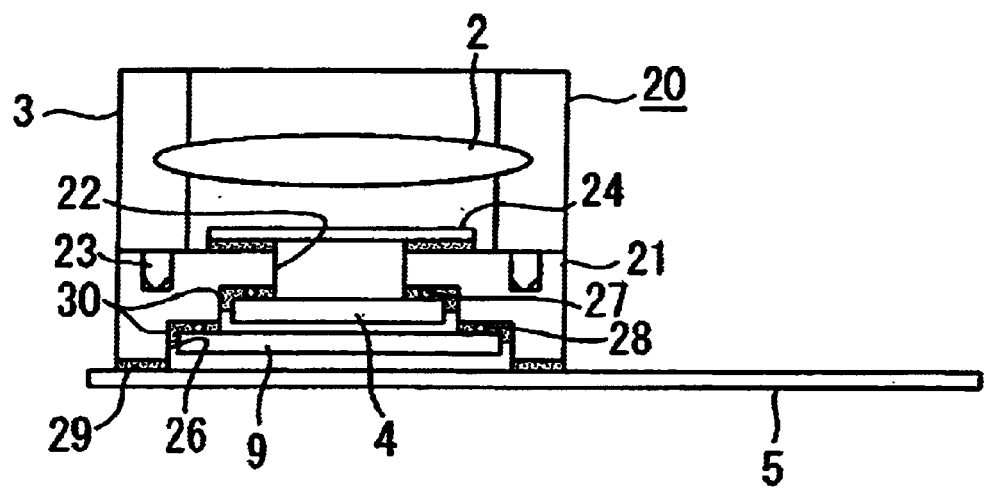
FIG. 4 is a cross-sectional view schematically showing a structure of a CMOS camera according to a third embodiment of the present invention.

FIG. 4 is a cross-sectional view showing a structure of a CMOS camera according to the third embodiment of the present invention. In the drawing, those elements which are the same as those shown in FIG. 3 are assigned the same reference numerals, and repetition of their explanations is omitted.

The CMOS camera according to the present embodiment differs from that shown in FIG. 3 in that the space defined between the image pick-up semiconductor 4 and the image processing semiconductor 9 is filled with insulating resin, to thereby bond them together.

In FIG. 4, reference numeral 31 designates insulating sealing resin used for filling the space defined between the image pick-up semiconductor 4 and the image processing semiconductor 9, to thereby bond them together. As in the case of the second embodiment, epoxy resin or silicon resin is used as insulating sealing resin. There may be a case where one type of resin is used for sealing the image pick-up semiconductor 4 and another type of resin is used for sealing the image processing semiconductor 9.

If the image pick-up semiconductor 4 and the image processing semiconductor 9 are bonded together, the size of encapsulation and an encapsulated area are increased, so that the entirety of a CMOS camera can be sealed robustly. Since the flip-chip-bonded sections of respective semiconductors are of improved reliability, the above-described structure is adopted, as required.

Fourth Embodiment

A fourth embodiment of the present invention will now be described by reference to corresponding drawings.

Figure 5A:
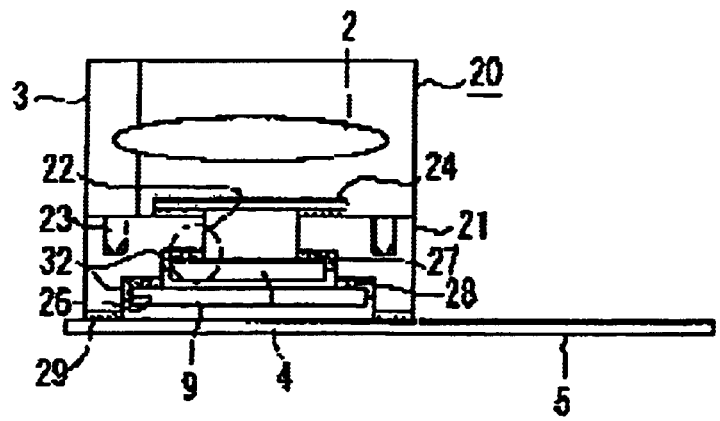
FIG. 5A is a cross-sectional view schematically showing a structure of a CMOS camera according to a fourth embodiment of the present invention.
Figure 5B:
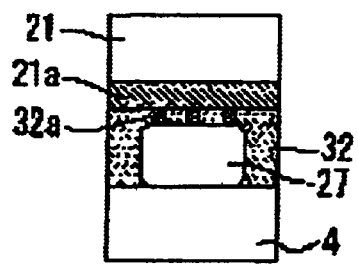
FIG. 5B is an enlarged view of an encircled area shown in FIG. 5A.

FIGS. 5A and 5B show a structure of a CMOS camera according to the fourth embodiment. FIG. 5A is a cross-sectional view showing the entire structure of a CMOS camera, and FIG. 5B is an enlarged view of an encircled area shown in FIG. 5A. In the drawings, those elements which are the same as those shown in FIG. 3 are assigned the same reference numerals, and repetition of their explanations is omitted.

In contrast with the CMOS camera shown in FIG. 3, the CMOS camera according to the present embodiment is characterized in that the projecting electrode 27 used for flip-flop bonding the image pick-up semiconductor 4, and the projecting electrode 28 used for flip-flop bonding the image processing semiconductor 9 are connected to the corresponding steps of the recess 26, by way of conductive particles contained in anisotropic conductive resin.

In FIG. 5A, reference numeral 32 designates anisotropic conductive resin applied to the surface of the projecting electrode 27 and there-around and anisotropic resin applied to the surface of the projecting electrode 28 and there-around. In a case where the anisotropic conductive resin 32 is applied to the projecting electrodes 27 and 28, the projecting electrodes 27 and 28 are connected to the stepped wiring board 21 not directly but by way of conductive particles contained in the anisotropic conductive resin 32.

FIG. 5B schematically shows in an enlarged manner the encircled area shown in FIG. 5A; that is, a connection between the projecting electrode 27 and the stepped wiring board 21.

In FIG. 5B, reference numeral 21a designates a connection section of the stepped wiring board 21; and 32a designates conductive particles contained in the anisotropic conductive resin 32. Since the conductive particles 32a have resilience, electrical connection is maintained between the connection section 21 and the projecting electrode 27, by means of a spring effect of the conductive particles 32a.

After having been sealed, anisotropic conductive resin becomes set at a predetermined temperature. After having become set, the anisotropic conductive resin serves as a member for reinforcing the strength of a flip-chip-bonded portion.

Fifth Embodiment

A fifth embodiment of the present invention will now be described by reference to a corresponding drawing.

Figure 6:
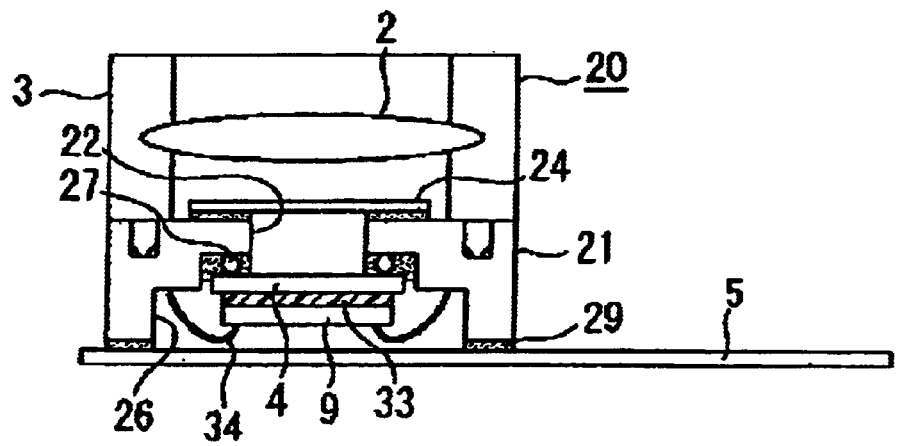
FIG. 6 is a cross-sectional view schematically showing a structure of a CMOS camera according to a fifth embodiment of the present invention.

FIG. 6 is a cross-sectional view schematically showing a structure of a CMOS camera according to the fifth embodiment. In the drawings, those elements which are the same as those shown in FIG. 2 are assigned the same reference numerals, and repetition of their explanations is omitted.

The CMOS camera according to the present embodiment differs from that shown in FIG. 2 in that the image processing semiconductor 9 is mounted on the image pick-up semiconductor 4 and wire-bonded to the stepped wiring board 21 instead of being flip-chip-bonded by projecting electrodes. In FIG. 6, reference numeral 33 designates insulating resin used for bonding the image pick-up semiconductor 4 to the image processing semiconductor 9; and 34 designates a wire-bonded connection used for connecting the image processing semiconductor 9 to the connection section (not shown) of the stepped wiring board 21.

In a case where two semiconductor chips are stacked by means of flip-chip bonding, as in the case of the present embodiment, inevitably, as illustrated in the present embodiment, a lower semiconductor chip is made smaller than an upper semiconductor chip; that is, the image processing semiconductor 9 is made smaller than the image pick-up semiconductor 4. However, so long as the image processing semiconductor 9 which is to be located below the image pick-up semiconductor 4 is wire-bonded to the image pick-up semiconductor 4, the above-described restriction can be avoided.

Sixth Embodiment

A sixth embodiment of the present invention will now be described by reference to a corresponding drawing.

Figure 7:
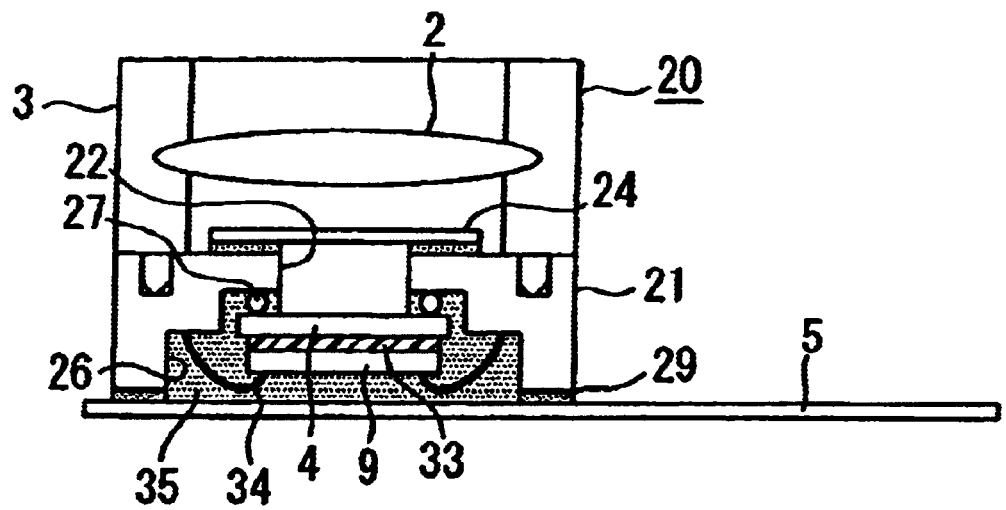
FIG. 7 is a cross-sectional view schematically showing a structure of a CMOS camera according to a sixth embodiment of the present invention.

FIG. 7 is a cross-sectional view schematically showing a structure of a CMOS camera according to the sixth embodiment. In the drawings, those elements which are the same as those shown in FIG. 6 are assigned the same reference numerals, and repetition of their explanations is omitted.

The CMOS camera according to the present embodiment differs from that shown in FIG. 6 in that the recess 26 of the stepped wiring board 21 is filled with insulating resin so as to encapsulate the flip-chip-bonded portion of the image pick-up semiconductor 4 and the wire-bonded portion of the image processing semiconductor 9. In FIG. 7, reference numeral 35 designates insulating sealing resin which is filled into the recess 26 of the stepped wiring board 21 and seals the recess 26 so as to encapsulate the flip-chip-bonded portion of the protruding electrode 27, the wire-bonded connection 34, the image pick-up semiconductor 4, and the image processing semiconductor 9.

The insulating sealing resin 35 reinforces the flip-chip-bonded portion, thereby preventing occurrence of an electrical short circuit between adjacent wires, which would otherwise be caused when a wire of the wire bonded connection 34 falls by means of vibration. Accordingly, the reliability of a connected portion can be improved.

Seventh Embodiment

A seventh embodiment of the present invention will now be described by reference to a corresponding drawing.

Figure 8:
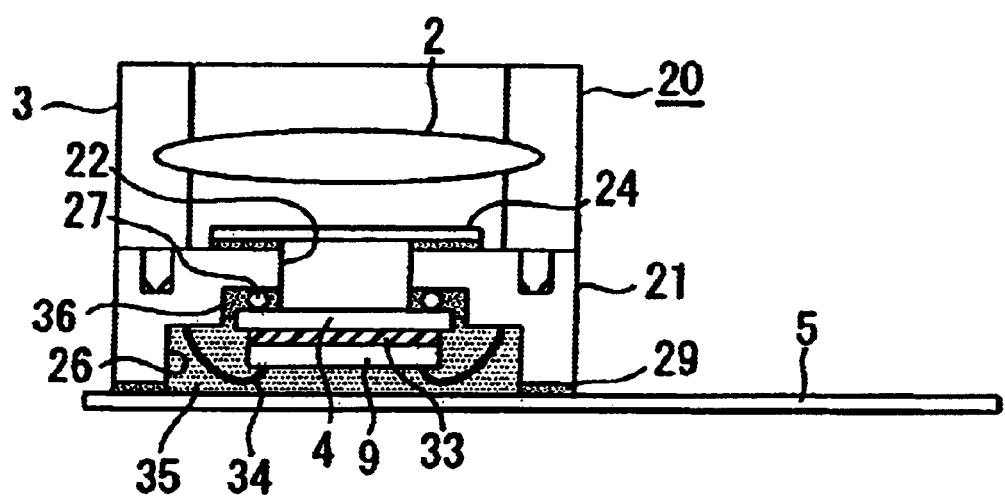
FIG. 8 is a cross-sectional view schematically showing a structure of a CMOS camera according to a seventh embodiment of the present invention.

FIG. 8 is a cross-sectional view schematically showing a structure of a CMOS camera according to the seventh embodiment. In the drawings, those elements which are the same as those shown in FIG. 7 are assigned the same reference numerals, and repetition of their explanations is omitted.

The CMOS camera according to the present embodiment differs from that shown in FIG. 7 in that the flip-chip-bonded portion of the image pick-up semiconductor 4 is sealed with insulating sealing resin of one type and the wire-bonded portion of the image processing semiconductor 9 is sealed with insulating sealing resin of another type. As shown in FIG. 8, reference numeral 36 designates insulating sealing resin for sealing a flip-chip-bonded portion of the image pick-up semiconductor 4.

The flip-chip-bonded portion and the wire-bonded portion are sealed with different epoxy resin or silicon resin. Sealing of the flip-chip-bonded portion is intended for under-filling purpose, and is required to mitigate a linear expansion mismatch arising between a base material and sealing resin, which would be attributable to a difference in mechanical properties between the base material and the sealing resin. To meet such requirement, a resin is used whose mechanical properties differ from those for a wire-bonded portion, since the wire-bonded portion does not require such properties.

Eighth Embodiment

An eighth embodiment of the present invention will now be described by reference to a corresponding drawing.

The present embodiment corresponds to the CMOS camera shown in FIG. 8 when the insulating sealing resin 36 used for sealing the flip-chip-bonded portion between the image pick-up semiconductor 4 and the stepped wiring board 21 is replaced with anisotropic conductive resin containing conductive particles.

Anisotropic conductive resin analogous to that described in connection with the fourth embodiment is used in the same manner as described previously, and the image pick-up semiconductor 4 and the stepped wiring board 21 are electrically connected together in the manner as shown in FIG. 5B. A wire-bonded portion is sealed through use of insulating sealing resin which does not contain conductive particles.

By means of sealing the flip-chip-bonded portion by use of the anisotropic conductive resin, the reliability of the flip-chip-bonded portion can be improved, and the strength of the flip-chip-bonded portion can be further enhanced.

Ninth Embodiment

A ninth embodiment of the present invention will now be described by reference to a corresponding drawing.

Figure 9:
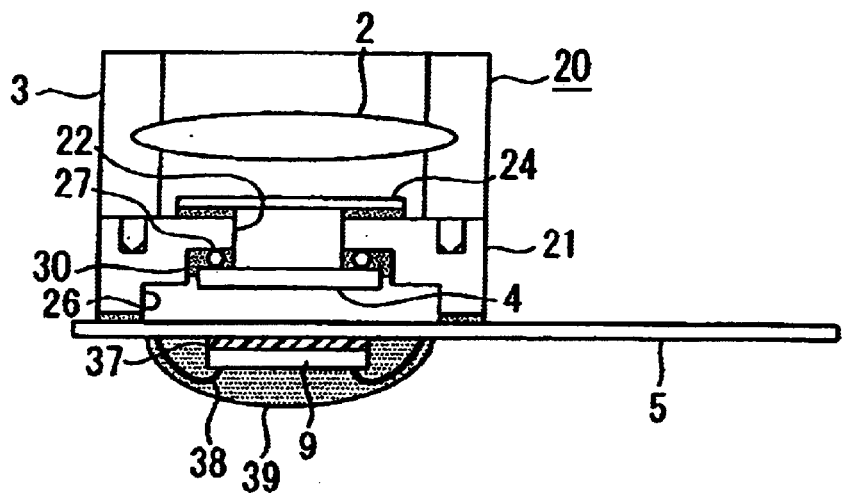
FIG. 9 is a cross-sectional view schematically showing a structure of a CMOS camera according to a ninth embodiment of the present invention.

FIG. 9 is a cross-sectional view schematically showing a structure of a CMOS camera according to the ninth embodiment. In the drawings, those elements which are the same as those shown in FIG. 3 are assigned the same reference numerals, and repetition of their explanations is omitted.

The CMOS camera according to the ninth embodiment differs from that shown in FIG. 3 in that the image processing semiconductor 9 is mounted on the flexible wiring board 5 and that a connection section of the flexible wiring board 5 wire-bonded to the image processing semiconductor 9 is sealed by insulating sealing resin. In FIG. 9, reference numeral 9 designates an image processing semiconductor which is mounted on the underside of the flexible wiring board 5 by means of insulating resin 37. Further, the connection section (not shown) of the flexible wiring board 5 is connected to the image processing semiconductor 9 by means of a wire-bonding connection 38. Reference numeral 39 designates insulating sealing resin for sealing the image processing semiconductor 9 and the wire bonding connection 38. The insulating sealing resin 39 differs from the insulating sealing resin 30 used for sealing the flip-chip-connected portion of the image pick-up semiconductor 4.

By means of such a configuration, the image pick-up semiconductor 4 is mounted on the stepped wiring board 21, and the image processing semiconductor 9 is mounted on the flexible wiring board 5. As a result, the image pick-up semiconductor 4 and the image processing semiconductor 9 can be formed as individual units. Accordingly, manufacturing processes can be easily rationalized. The image pick-up semiconductor 4 and the image processing semiconductor 9 can be separately evaluated as being non-defective or defective. Only a non-defective image pick-up semiconductor 4 and a non-defective image processing semiconductor 4 are assembled into a CMOS camera shown in FIG. 9. Therefore, the yield of the CMOS camera is improved. In the case of a CMOS camera in which the image pick-up semiconductor 4 and the image processing semiconductor 9 are stacked, as mentioned in connection with the previous embodiment, the two semiconductor chips are collectively evaluated after assembly. If one of the semiconductor chips is evaluated as being defective, the CMOS camera must be discarded even if the remaining semiconductor chip is non-defective.

Tenth Embodiment

A tenth embodiment of the present invention will now be described by reference to a corresponding drawing.

Figure 10:
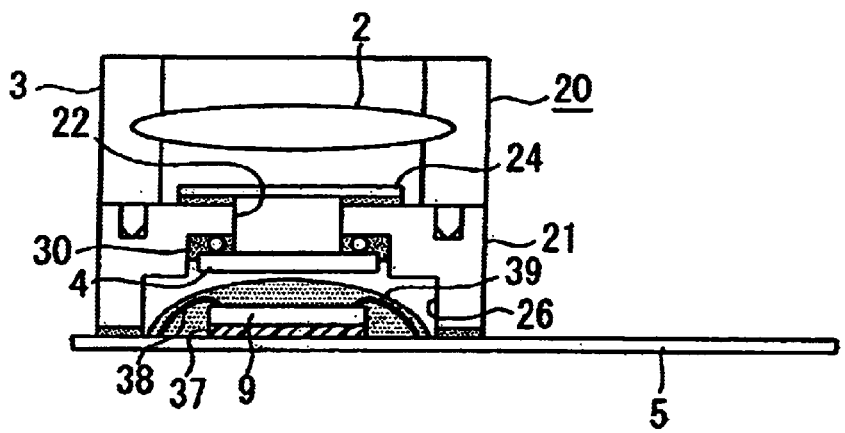
FIG. 10 is a cross-sectional view schematically showing a structure of a CMOS camera according to a tenth embodiment of the present invention.

FIG. 10 is a cross-sectional view schematically showing a structure of a CMOS camera according to the tenth embodiment. In the drawings, those elements which are the same as those shown in FIG. 9 are assigned the same reference numerals, and repetition of their explanations is omitted.

The CMOS camera according to the present embodiment differs from that shown in FIG. 9 in that the image processing semiconductor 9 is mounted on the surface of the flexible wiring board 5, which surface is opposite the stepped wiring board 21, so as to be located within the recess 26 of the stepped wiring board 21. As a result, the thickness (or vertical dimension) of the CMOS camera is reduced, thus enabling further miniaturization of the CMOS camera.

Eleventh Embodiment

An eleventh embodiment of the present invention will now be described by reference to a corresponding drawing.

Figure 11:
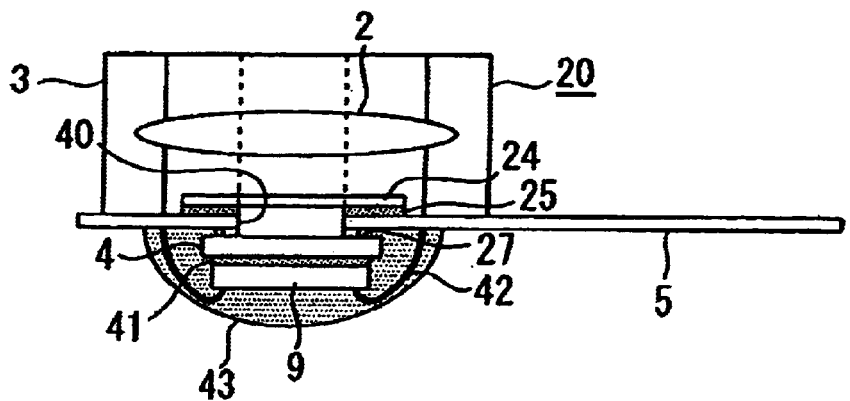
FIG. 11 is a cross-sectional view schematically showing a structure of a CMOS camera according to an eleventh embodiment of the present invention.

FIG. 11 is a cross-sectional view schematically showing a structure of a CMOS camera according to the eleventh embodiment. In the present embodiment, the stepped wiring board 21 is not used, and the lens unit 3, the image pick-up semiconductor 4, and the image processing semiconductor 9 are mounted on the flexible wiring board 5.

In FIG. 11, reference numeral 40 designates an image pick-up opening formed in the flexible wiring board 4; and 3 designates a lens unit provided on the surface of the flexible wiring board 5. The lens 2 is provided in the front of the image pick-up opening 40. Reference numeral 24 designates a filter, such as an infrared-ray cutting filter or a high-frequency cutting filter, provided in the image pick-up opening 40. The filter 24 is bonded to one side of the flexible wiring board 5 by means of an adhesive 25.

The image pick-up semiconductor 4 is provided on the other side of the flexible wiring board 5 and opposite the image pick-up opening 40. The image pick-up semiconductor 4 is flip-chip-bonded to the connection section (not shown) of the flexible wiring board 5 by way of the projecting electrode (bump) 27. The projecting electrode 27 may be provided on either of the flexible wiring board 5 and the image pick-up semiconductor 4.

The image processing semiconductor 9 for processing an image signal output from the image pick-up semiconductor 4 is bonded to the image pick-up semiconductor 4 by way of insulating resin 41. The image processing semiconductor 9 is connected to another connection section (not shown) of the flexible wiring board 5 by means of wires 42 through wire bonding.

Reference 43 designates insulating sealing resin for wholly sealing the image pick-up semiconductor 4, the projecting electrode 27 flip-chip-bonded thereto, the image processing semiconductor 9, and the wires 42.

The CMOS camera 20 is constituted in the manner as mentioned above. Since the present embodiment does not employ the stepped wiring board 21, the CMOS camera 20 can be made compact to a greater extent and made much less costly.

Twelfth Embodiment

A twelfth embodiment of the present invention will now be described by reference to a corresponding drawing.

Figure 12:
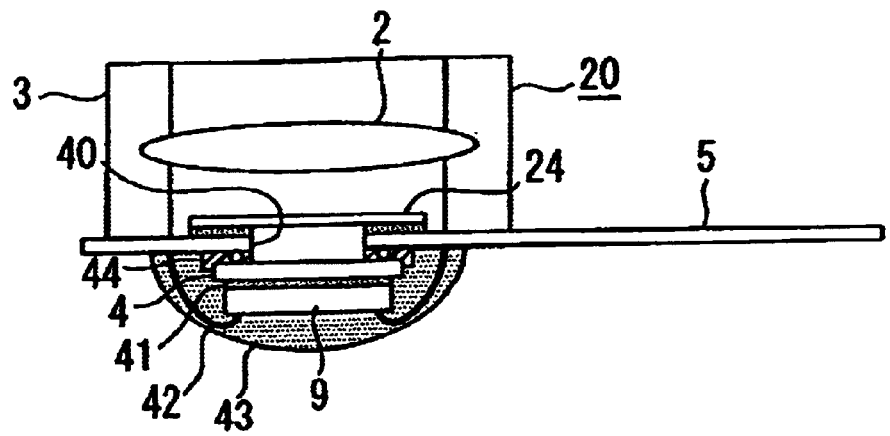
FIG. 12 is a cross-sectional view schematically showing a structure of a CMOS camera according to a twelfth embodiment of the present invention.

FIG. 12 is a cross-sectional view schematically showing a structure of a CMOS camera 20 according to the twelfth embodiment. In the drawings, those elements which are the same as those shown in FIG. 11 are assigned the same reference numerals, and repetition of their explanations is omitted.

The CMOS camera 20 according to the present embodiment differs from that shown in FIG. 11 in that the projecting electrode 27 which is flip-chip-bonded to the image pick-up semiconductor 4 is sealed by insulating sealing resin 44 differing from the insulating sealing resin 43.

In the present embodiment, after the projecting electrode 27 flip-chip-bonded to the image pick-up semiconductor 4 has been sealed with insulating sealing resin 44, the entirety of the CMOS camera 20 is encapsulated in another insulating sealing resin 43. As a result, the reliability of the flip-chip-bonded portions and wire-bonded portions can be improved, and the strength of the same can be sufficiently reinforced.

Thirteenth Embodiment

A thirteenth embodiment of the present invention will now be described by reference to a corresponding drawing.

Figure 13:
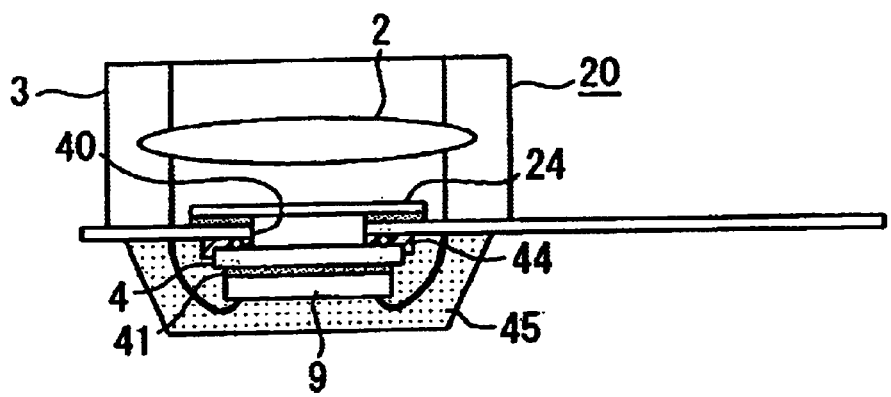
FIG. 13 is a cross-sectional view schematically showing a structure of a CMOS camera according to a thirteenth embodiment of the present invention.

FIG. 13 is a cross-sectional view schematically showing a structure of a CMOS camera 20 according to the thirteenth embodiment. In the drawing, those elements which are the same as those shown in FIG. 12 are assigned the same reference numerals, and repetition of their explanations is omitted.

The CMOS camera 20 according to the present embodiment differs from that shown in FIG. 12 in that the insulating sealing resin 43 used for encapsulating the entirety of the CMOS camera 20 (in FIG. 12) is replaced with sealing resin for transfer molding in order to improve the moldability of an outer shape of the CMOS camera 20. In FIG. 13, reference numeral 45 designates the insulating sealing resin for transfer molding.

As a result, the moldability of the insulating sealing resin 45 is improved, wherewith the value of a product can be improved.

Fourteenth Embodiment

A fourteenth embodiment of the present invention will now be described by reference to a corresponding drawing.

Figure 14:
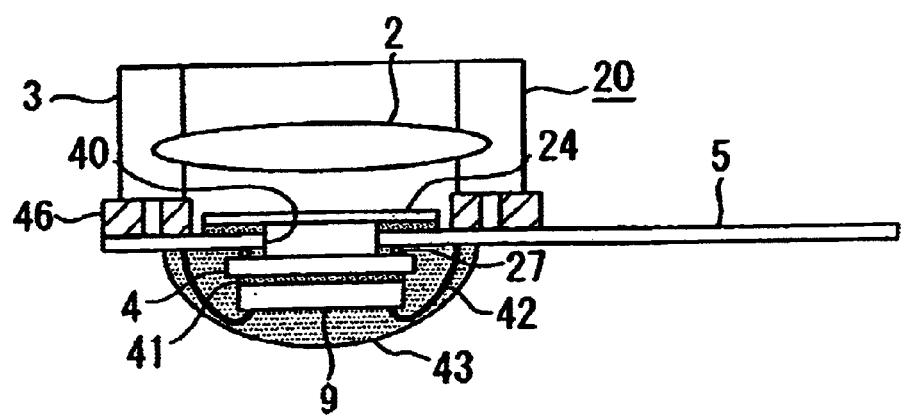
FIG. 14 is a cross-sectional view schematically showing a structure of a CMOS camera according to a fourteenth embodiment of the present invention.

FIG. 14 is a cross-sectional view schematically showing a structure of a CMOS camera 20 according to the fourteenth embodiment. In the drawings, those elements which are the same as those shown in FIG. 11 are assigned the same reference numerals, and repetition of their explanations is omitted.

The CMOS camera 20 according to the present embodiment differs from that shown in FIG. 11 in that a reinforcement plate 46 is provided in the area where the lens unit 3 is mounted on the flexible wiring board 5.

The reinforcement plate 46 is formed from a metal plate such as a copper plate or an aluminum plate, or from the same material as that of the flexible wiring board 5. The reinforcement plate 46 is bonded to the flexible wiring board 5 and the lens unit 3 through use of an appropriate adhesive.

Fifteenth Embodiment

A fifteenth embodiment of the present invention will now be described by reference to a corresponding drawing.

Figure 15:
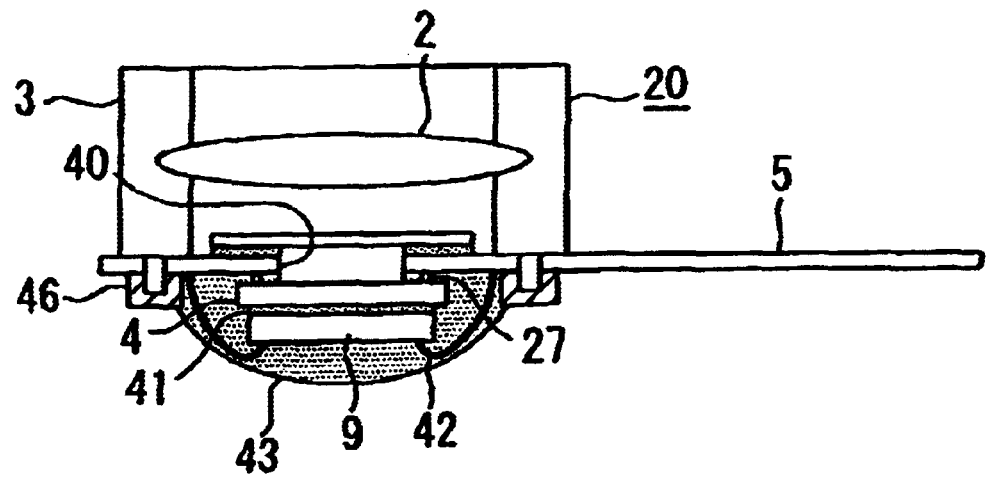
FIG. 15 is a cross-sectional view schematically showing a structure of a CMOS camera according to a fifteenth embodiment of the present invention.

FIG. 15 is a cross-sectional view schematically showing a structure of a CMOS camera 20 according to the fifteenth embodiment. In the drawing, those elements which are the same as those shown in FIG. 14 are assigned the same reference numerals, and repetition of their explanations is omitted.

The CMOS camera 20 according to the present embodiment differs from that shown in FIG. 14 in that the reinforcement plate 46 is provided in a position on the underside of the flexible wiring board 5, the position corresponding to the position on the front side of the flexible wiring board 5 on which the lens unit 3 is mounted.

The reinforcement plate 46 is provided so as to enclose the image pick-up semiconductor 4 and the image processing semiconductor 9, and workd as a dam at the time the CMOS camera 20 is encapsulated and molded with the insulating sealing resin 43.

Sixteenth Embodiment

A sixteenth embodiment of the present invention will now be described by reference to a corresponding drawing.

Figure 16:
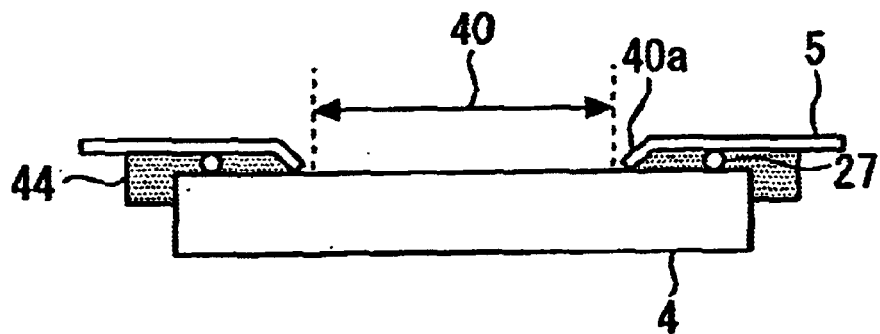
FIG. 16 is a cross-sectional view schematically showing a partial structure of a CMOS camera according to a sixteenth embodiment of the present invention.

FIG. 16 is a cross-sectional view schematically showing a structure of a CMOS camera 20 according to the sixteenth embodiment. The present embodiment is intended to prevent flow of the insulating sealing resin 44 into the image pick-up opening 40 shown in FIG. 12, which would otherwise be caused when sealing the projecting electrode 27 of the image pick-up semiconductor 4 with the insulating sealing resin 44. As illustrated, the inner peripheral edge of the image pick-up opening 40 formed in the polyimide-made flexible wiring board 5 is inwardly bent toward the image pick-up semiconductor 4 by only a predetermined length designated by 40a, to thereby close a gap between the flexible wiring board 5 and the image pick-up semiconductor 4.

As a result, there can be effectively prevented flow of the insulating sealing resin 44 into the image pick-up opening 40.

Seventeenth Embodiment

A seventeenth embodiment of the present invention will now be described by reference to a corresponding drawing.

Figure 17:
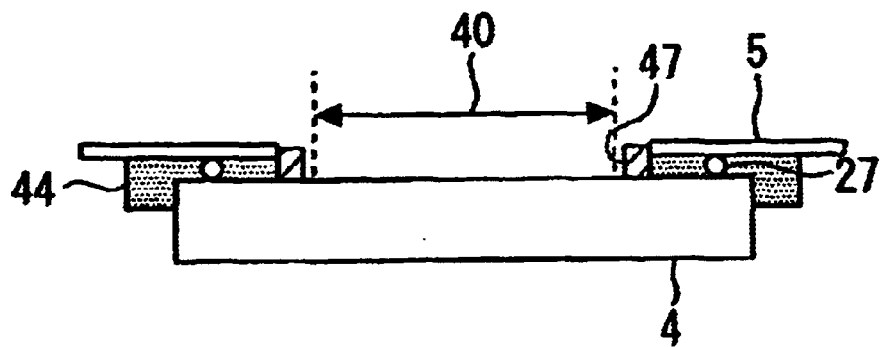
FIG. 17 is a cross-sectional view schematically showing a partial structure of a CMOS camera according to a seventeenth embodiment of the present invention.

FIG. 17 is a cross-sectional view schematically showing a structure of a CMOS camera 20 according to the seventeenth embodiment. The present embodiment is intended for the same purpose as that for which the sixteenth embodiment is intended. An insulating projection 47 is formed along the inner peripheral edge of the image pick-up opening 40 formed in the flexible wiring board 5, to thereby close a gap between the flexible wiring board 5 and the image pick-up semiconductor 4.

Eighteenth Embodiment

An eighteenth embodiment of the present invention will now be described by reference to a corresponding drawing.

Figure 18A:
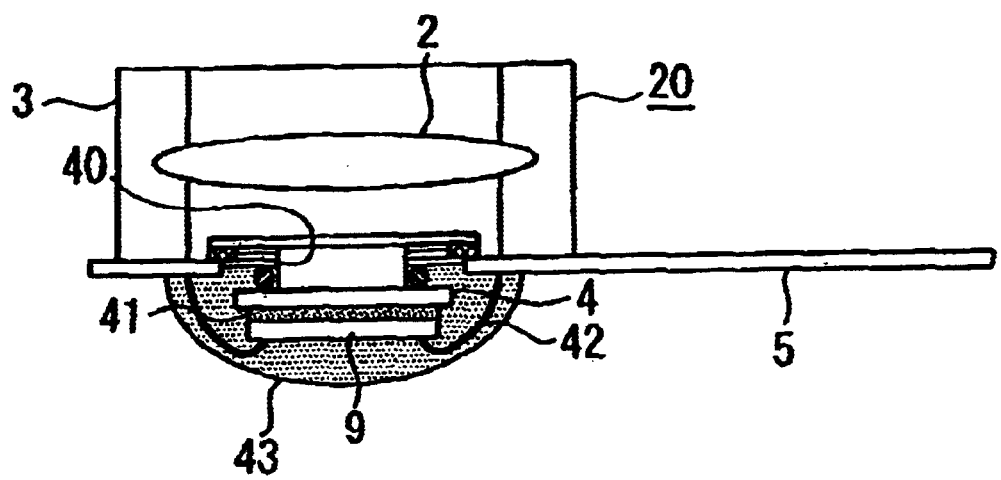
FIG. 18A is a cross-sectional view schematically showing a structure of the CMOS camera according to an eighteenth embodiment.
Figure 18B:
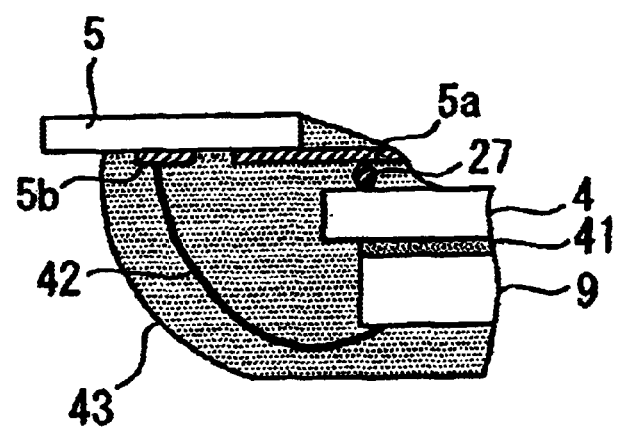
FIG. 18B is an enlarged view of the area encircled in FIG. 18A.

FIGS. 18A and 18B show a structure of a CMOS camera 20 according to the eighteenth embodiment. FIG. 18A is a schematic representation showing the entire structure of the CMOS camera 20, and FIG. 18B is a partial enlarged view of the CMOS camera 20 shown in FIG. 18A.

The present embodiment is directed toward the CMOS camera 20 shown in FIG. 11, in which a wire bonded to the flexible wiring board 5 projects therefrom toward the image pick-up opening 40, as shown in FIG. 18B, and the flexible wiring board 5 is connected to the image pick-up semiconductor 4 by way of the projecting wire.

As shown in FIGS. 18A and 18B, reference numeral 5a designates a wire projecting from the flexible wiring board 5 toward the center of the image pick-up opening 40, and 5b designates a connection section connected to the image processing semiconductor 9.

As shown in FIG. 18B, the image pick-up semiconductor 4 is connected to the wire 5a that projects from the flexible wiring board 5, by way of the projecting electrode (bump) 27. The image processing semiconductor 9 is connected to another connection section 5b of the flexible wiring board 5 by way of the wire 42. As shown in FIG. 18B, the portion of the image pick-up semiconductor 4 bonded to the projecting electrode 27, and the wire-bonded portion of the image processing semiconductor 9 are encapsulated in the insulating sealing resin 43.

Nineteenth Embodiment

A nineteenth embodiment of the present invention will now be described by reference to a corresponding drawing.

Figure 19A:
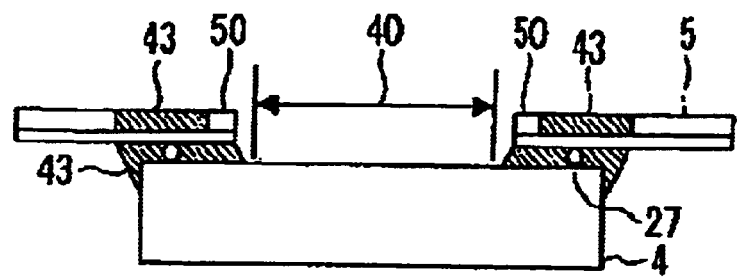
FIG. 19A is a cross-sectional view schematically showing a partial structure of a CMOS camera according to a nineteenth embodiment of the present invention.
Figure 19B:
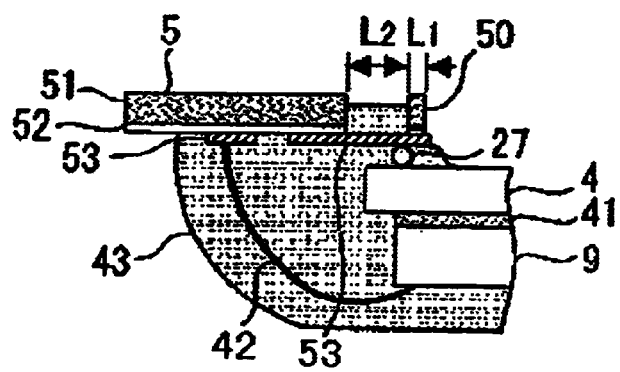
FIG. 19B is an enlarged view showing the structure of a dam-like protrusion of the flexible wiring board shown in FIG. 19A.
Figure 20:
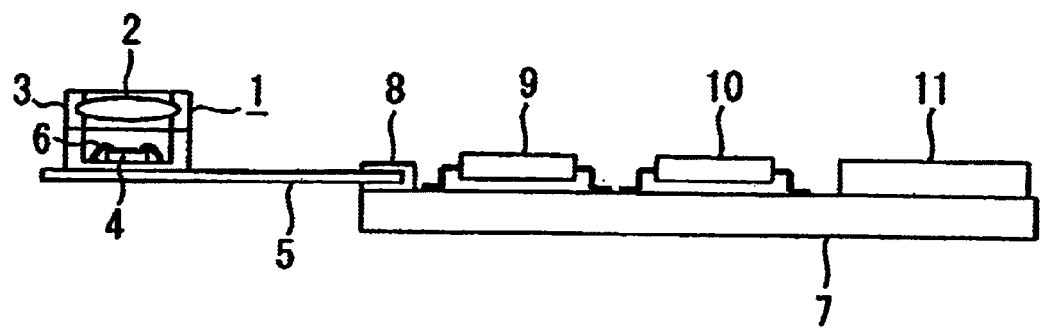
FIG. 20 is a schematic representation showing a structure of a conventional CMOS camera system.

FIGS. 19A and 19B show a structure of a CMOS camera 20 according to the nineteenth embodiment. FIG. 19A is a schematic representation showing the structure of a surrounding area of the image pick-up opening 40, and FIG. 19B is an enlarged view showing the structure of a dam-like protrusion of the flexible wiring board 5.

The present embodiment is principally based on the flexible wiring board 5 described in connection with the eighteenth embodiment and prevents flow of the insulating sealing resin 43 into the image pick-up opening 40, as in the case of the sixteenth embodiment.

As in the case of the seventeenth embodiment, the present embodiment is intended to form an insulating protuberance on the wire 53 which projects from the flexible wiring board 5 toward the center of the image pick-up opening 40, such that the insulating protuberance acts as a dam for preventing flow of insulating sealing resin.

As shown in FIG. 19B, the flexible wiring board 5 has a cross section such that a copper foil is bonded as a wire 53 on the surface of a polyimide material 51 by means of the adhesive 52. As shown in FIG. 19B, the polyimide material 51 and the adhesive 52 are removed from area L2 so as to leave area L1, by means of an appropriate method. As a result, there is produced the flexible wiring board 50 in which the copper foil 53 projects from the flexible wiring board 5 and the insulating polyimide-made protuberance 50 is formed in the area L1 on the copper foil 53. The insulating protuberance 50 acts as a dam at the time of encapsulation of the CMOS camera 20 in the insulating sealing resin 43. Thus, the objective of the present embodiment can be achieved.

The features and the advantages of the present invention may be summarized as follows.

According to one aspect of the present invention, a semiconductor device constituting a CMOS camera system comprises a lens unit, an image pick-up semiconductor and an image processing semiconductor. The lens unit includes a wiring board having an image pick-up opening formed therein and a lens, and the lens is provided on one side of the wiring board and positioned opposite the image pick-up opening. The image pick-up semiconductor is provided on the other side of the wiring board, and is positioned opposite the image pick-up opening and is connected to a connection section of the wiring board by means of flip-chip bonding. The image processing semiconductor is connected to another connection section provided on the other side of the wiring board by means of flip-chip bonding and processes an image signal output from the image pick-up semiconductor. Since the CMOS camera and the image processing semiconductor are assembled into a single unit, a CMOS camera system can be made compact and less costly.

In another aspect of the invention, preferably, a recess is formed on the other side of the wiring board. The recess comprises at least two steps formed so as to communicate with the image pick-up opening. One of the steps has one connection section of the wiring board, and the other step has another connection section of the wiring board. The image pick-up semiconductor is connected to the connection section provided on the step closer to the image pick-up opening of the recess, by means of flip-chip bonding. The image processing semiconductor is connected to the connection section provided on the other step, by means of flip-chip bonding. Thus, there can be produced a compact CMOS camera, which in turn readily renders the entirety of a CMOS camera system compact.

In another aspect of the invention, preferably, the connection section of the wiring board connected to the image pick-up semiconductor, and the connection section of the wiring board connected to the image processing semiconductor are sealed with insulating sealing resin. Accordingly, the reliability and strength of the connection sections can be improved.

In another aspect of the invention, preferably, a projecting electrode is provided on either the image pick-up semiconductor or the connection section of the wiring board corresponding to the image pick-up semiconductor, and another projecting electrode is provided on either the image processing semiconductor or the connection section of the wiring board corresponding to the image processing semiconductor. The connection section of the wiring board is connected to the image pick-up semiconductor by means of flip-chip bonding while conductive particles contained in anisotropic conductive resin are sandwiched between the projecting electrode and the connection section. Similarly, the connection section of the wiring board is connected to the image pick-up semiconductor by means of flip-chip bonding while conductive particles contained in the anisotropic conductive resin are sandwiched between the projecting electrode and the connection section. The spring effect due to the resilience of the conductive particles makes electrical connection between the projecting electrode and the connection section sufficient.

According to another aspect of the present invention, a semiconductor device constituting a CMOS camera system comprises a lens unit, an image pick-up semiconductor and an image processing semiconductor. The lens unit includes a wiring board having an image pick-up opening formed therein and a lens, and the lens is provided on one side of the wiring board and positioned opposite the image pick-up opening. The image pick-up semiconductor is provided on the other side of the wiring board, thus positioned opposite the image pick-up opening, and is connected to a connection section of the wiring board by means of flip-chip bonding. The image processing semiconductor which is connected to another connection section provided on the other side of the wiring board by means of wire bonding and processes an image signal output from the image pick-up semiconductor. As a result, semiconductor chips can be bonded together and encapsulated strongly. Since the size of an encapsulated portion or an encapsulated area is increased, the reliability of the connection sections is improved.

In another aspect of the invention, preferably, the recess of a stepped wiring board is sealed with insulating sealing resin, to thereby encapsulate flip-chip-bonded portions, wire-bonded portions, the image pick-up semiconductor, and the image processing semiconductor. There can be prevented occurrence of failures, such as occurrence of a short circuit between adjacent wires, which would otherwise be caused when a wire wire-bonded to the connection section falls by vibration.

According to another aspect of the present invention, a semiconductor device constituting a CMOS camera system comprises a wiring board, a lens unit, an image pick-up semiconductor and an image processing semiconductor. The wiring board is mounted on a flexible wiring board, has an image pick-up opening and a recess formed between the image pick-up opening and the flexible wiring board so as to communicate with the image pick-up opening, and includes a connection section provided within the recess. The lens unit is provided on the side of the wiring board opposite the flexible wiring board so as to oppose the image pick-up opening. The image pick-up semiconductor is provided within the recess of the wiring board so as to oppose the image pick-up opening, and is connected to the connection section of the recess by means of flip-chip bonding. The image processing semiconductor is connected to a connection section of the flexible wiring board by means of wire bonding. Since the image pick-up semiconductor and the image processing semiconductor can be made independently of each other, manufacturing processes become easy to rationalize. Further, the image pick-up semiconductor and the image processing semiconductor can be evaluated independently, which in turn contributes to an improvement in manufacturing yield of products.

According to another aspect of the present invention, a semiconductor device constituting a CMOS camera system comprises a lens unit, an image pick-up semiconductor and an image processing semiconductor. The lens unit includes flexible wiring board having an image pick-up opening formed therein and a lens, and the lens is provided on one side of the flexible wiring board and positioned opposite the image pickup opening. The image pick-up semiconductor is provided on the other side of the flexible wiring board and positioned opposite the image pick-up opening, and is connected to a connection section of the flexible wiring board by means of flip-chip bonding. The image processing semiconductor is mounted on the image pick-up semiconductor and is connected to another connection section provided on the other side of the flexible wiring board by means of wire bonding. Since a stepped wiring board is not used, the CMOS camera system can be made more compact and less costly.

In another aspect of the invention, preferably, the lens unit is mounted on one side of the flexible wiring board by way of a reinforcement member, thereby enhancing the strength of a portion of the lens unit at which the lens unit is mounted on the flexible wiring board. Thus, the portion of the image pick-up semiconductor connected to the flexible wiring board by means of flip-chip bonding can also be improved.

In another aspect of the invention, preferably, an inner peripheral edge of the image pick-up opening formed in the flexible wiring board is bent toward the image pick-up semiconductor. Alternatively, the inner peripheral edge of the image pick-up opening is provided with an insulating protuberance. Hence, the insulating protuberance can effectively prevent flow of resin into the image pick-up opening, which would otherwise be caused when the flip-chip-bonded portion of the image pick-up semiconductor is encapsulated in insulating sealing resin.

Now, in addition to the claimed invention, the present invention includes the following variations.

According to another aspect, a semiconductor device constitutes a CMOS camera system. The semiconductor device comprises a lens unit, an image pick-up semiconductor and an image processing semiconductor. The lens unit includes a flexible wiring board having an image pick-up opening formed therein and a lens, and the lens is provided on one side of the flexible wiring board and positioned opposite the image pick-up opening. The image pick-up semiconductor is provided on the other side of the flexible wiring board and positioned opposite the image pick-up opening, and is connected to a connection section of the flexible wiring board by means of flip-chip bonding. The image processing semiconductor is mounted on the image pick-up semiconductor and is connected to another connection section provided on the other side of the flexible wiring board by means of wire bonding.

In another aspect, in the semiconductor device, a flip-chip-connected portion of the image pick-up semiconductor and a wire-bonded portion of the image processing semiconductor are sealed with insulating sealing resin.

In another aspect, in the semiconductor device, a flip-chip-connected portion of the image pick-up semiconductor is sealed with insulating sealing resin of one type, and a wire-bonded portion of the image processing semiconductor is sealed with insulating sealing resin of another type.

In another aspect, in the semiconductor device, a flip-chip-connected portion of the image pick-up semiconductor is sealed with insulating sealing resin. The thus-sealed portion, the image processing semiconductor, and a wire-bonded portion of the image processing semiconductor are sealed by transfer molding.

In another aspect, in the semiconductor device, the lens unit is mounted on one side of the flexible wiring board by way of a reinforcement member.

In another aspect, in the semiconductor device, a reinforcement member for enclosing the image pick-up semiconductor and the image processing semiconductor is provided on the other side of the flexible wiring board and in a position corresponding to the area on which the lens unit is mounted.

In another aspect, in the semiconductor device, an inner peripheral edge of the image pick-up opening formed in the flexible wiring board is bent toward the image pickup semiconductor.

In another aspect, in the semiconductor device, the inner peripheral edge of the image pick-up opening is provided with an insulating protuberance.

In another aspect, in the semiconductor device, wiring provided on the flexible wiring board is caused to project toward the center of the image pick-up opening, and the image pick-up semiconductor is connected to the wiring by way of the projecting wire.

In another aspect, in the semiconductor device, wiring provided on the flexible wiring board is caused to project toward the center of the image pick-up opening, the image pick-up semiconductor is connected to the wiring, and an insulating projection is provided at the end of the wiring.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-240235, filed on Aug. 26, 1999 including specification, claims, drawings and summary, on which the Convention priority of the present application is based, are incorporated herein by reference in its entirety.

What is claimed is:

1. A semiconductor device constituting a CMOS camera system, comprising:
   a lens unit including a wiring board having an image pick-up opening formed therein and a lens, the lens being provided on one side of the wiring board and positioned opposite the image pick-up opening;
   an image pick-up semiconductor which is provided on the other side of the wiring board, positioned opposite the image pick-up opening, and is connected to a connection section of the wiring board by means of flip-chip bonding; and
   an image processing semiconductor which is connected to another connection section provided on the other side of the wiring board by means of flip-chip bonding and which processes an image signal output from the image pick-up semiconductor.

2. The semiconductor device according to claim 1, wherein a recess is formed on the other side of the wiring board and comprises at least two steps formed so as to communicate with the image pick-up opening, one of the steps having one connection section of the wiring board, and the other step having another connection section of the wiring board; the image pick-up semiconductor is connected to the connection section provided on the step closer to the image pick-up opening of the recess, by means of flip-chip bonding; and the image processing semiconductor is connected to the connection section provided on the other step, by means of flip-chip bonding.

3. The semiconductor device according to claim 1, wherein the one connection section of the wiring board is connected to the image pick-up semiconductor by means of flip-chip bonding by way of a projecting electrode provided on either the connection section of the wiring board or the image pick-up semiconductor, and the other connection section of the wiring board is connected to the image processing semiconductor by means of flip-chip bonding by way of a projecting electrode provided on either the connection section of the wiring board or the image processing semiconductor.

4. The semiconductor device according to claim 3, wherein the connection section of the wiring board is flip-chip-connected to the image pick-up semiconductor by way of a projecting electrode provided on either the connection section of the wiring board or the image pick-up semiconductor while conductive particles contained in anisotropic conductive resin are sandwiched between the projecting electrode and the connection section, and the connection section of the wiring board is flip-chip-connected to the image pick-up semiconductor by way of a projecting electrode provided on either the connection section of the wiring board or the image processing semiconductor while conductive particles contained in anisotropic conductive resin are sandwiched between the projecting electrode and the connection section.

5. The semiconductor device according to claim 1, wherein the image pick-up semiconductor and the image processing semiconductor are not bonded together.

6. The semiconductor device according to claim 1, wherein the connection section of the wiring board flip-chip-connected to the image pick-up semiconductor, and the connection section of the wiring board flip-chip-connected to the image processing semiconductor are sealed with insulating sealing resin.

7. The semiconductor device according to claim 6, wherein a flip-chip-connected portion between the image pick-up semiconductor and the wiring board is sealed with insulating sealing resin of one type, and a flip-chip-connected portion between the image processing semiconductor and the wiring board is sealed with insulating sealing resin of another type.

8. The semiconductor device according to claim 1, wherein the image pick-up semiconductor and the image processing semiconductor are bonded by way of insulting resin.

9. The semiconductor device according to claim 1, wherein the wiring board is coupled to a motherboard by way of a flexible wiring board, and a display is provided on the motherboard for displaying an image corresponding to a signal processed by the image processing semiconductor.

10. A semiconductor device constituting a CMOS camera system, comprising:
    a lens unit including a wiring board having an image pick-up opening formed therein and a lens, the lens being provided on one side of the wiring board and positioned opposite the image pick-up opening;
    an image pick-up semiconductor which is provided on the other side of the wiring board, positioned opposite the image pick-up opening, and is connected to one connection section of the wiring board by means of flip-chip bonding; and
    an image processing semiconductor which is connected to another connection section provided on the other side of the wiring board by means of wire bonding and which processes an image signal output from the image pick-up semiconductor.

11. The semiconductor device according to claim 10, wherein a recess is formed on the other side of the wiring board and comprises at least two steps formed so as to communicate with the image pick-up opening, one of the steps having one connection section of the wiring board, and the other step having another connection section of the wiring board; the image pick-up semiconductor is connected to the one connection section provided on the step closer to the image pick-up opening of the recess, by means of flip-chip bonding; and the image processing semiconductor is connected to the another connection section provided on the other step, by means of wire bonding.

12. The semiconductor device according to claim 11, wherein the recess of a stepped wiring board is sealed with insulating sealing resin, to thereby encapsulate flip-chip-bonded portions, wire-bonded portions, the image pick-up semiconductor, and the image processing semiconductor.

13. The semiconductor device according to claim 10, wherein the flip-chip-connected portion is sealed with insulating sealing resin of one type, and the wire-bonded portion is sealed with insulating sealing resin of another type.

14. The semiconductor device according to claim 10, wherein the connection section of the wiring board is flip-chip-connected to the image pick-up semiconductor by way of a projecting electrode provided on either the connection section of the wiring board or the image pick-up semiconductor while conductive particles contained in anisotropic conductive resin are sandwiched between the projecting electrode and the connection section, and a wire-bonded section is sealed with insulating sealing resin which does not contain any conductive particles.

15. The semiconductor device according to claim 10, wherein the wiring board is coupled to a motherboard by way of a flexible wiring board, and a display is provided on the motherboard for displaying an image corresponding to a signal processed by the image processing semiconductor.

16. A semiconductor device constituting a CMOS camera system, comprising:

a flexible wiring board having a connection section on one side;

a wiring board which is mounted on the other side of the flexible wiring board and which has an image pick-up opening and a recess formed between the image pick-up opening and the flexible wiring board so as to communicate with the image pick-up opening, and which includes a connection section provided within the recess;

a lens unit which is provided on the one side of the wiring board opposite the flexible wiring board so as to oppose the image pick-up opening;

an image pick-up semiconductor which is provided within the recess of the wiring board so as to oppose the image pick-up opening, and is connected to the connection section of the recess by means of flip-chip bonding; and an image processing semiconductor connected to the connection section of the flexible wiring board by means of wire bonding.

17. The semiconductor device according to claim 16, wherein the image processing semiconductor is mounted on the surface of the wiring board opposite the surface on which the image pick-up semiconductor is mounted.

18. The semiconductor device according to claim 16, wherein the image processing semiconductor is mounted within the recess and on the same surface of the wiring board on which the image pick-up semiconductor is mounted.

19. The semiconductor device according to claim 16, wherein a flip-chip-connected portion of the image pick-up semiconductor is sealed with insulating sealing resin of one type, and a wire-bonded portion of the image processing semiconductor is sealed with insulating sealing resin of another type.

* * * * *